(12) United States Patent
Chen et al.

(10) Patent No.: US 11,437,343 B2
(45) Date of Patent: Sep. 6, 2022

(54) FULL-AUTOMATIC DEEP ACCESS BALL BONDING HEAD DEVICE

(71) Applicant: NINGBO SHANGJIN AUTOMATION TECHNOLOGY CO., LTD., Ningbo (CN)

(72) Inventors: Wen Chen, Ningbo (CN); Weiguang Niu, Ningbo (CN); Bing Pan, Ningbo (CN)

(73) Assignee: ZHEJIANG RUIQUN TECHNOLOGY CO., LTD., Zhejiang (CN)

( * ) Notice: Subject to any disclaimer, the term of this patent is extended or adjusted under 35 U.S.C. 154(b) by 194 days.

(21) Appl. No.: 16/945,500

(22) Filed: Jul. 31, 2020

(65) Prior Publication Data

US 2021/0057374 A1  Feb. 25, 2021

(30) Foreign Application Priority Data

Aug. 19, 2019 (CN) .......................... 201910764029.X

(51) Int. Cl.
*B23K 20/10* (2006.01)
*H01L 23/00* (2006.01)
*B23K 101/40* (2006.01)

(52) U.S. Cl.
CPC ............ *H01L 24/78* (2013.01); *B23K 20/10* (2013.01); *B23K 2101/40* (2018.08); *H01L 2224/78267* (2013.01); *H01L 2224/78824* (2013.01); *H01L 2224/78901* (2013.01)

(58) Field of Classification Search
None
See application file for complete search history.

(56) References Cited

U.S. PATENT DOCUMENTS

| | | | | |
|---|---|---|---|---|
| 3,863,827 A | * | 2/1975 | Foulke | H01L 24/78 228/1.1 |
| 4,266,710 A | * | 5/1981 | Bilane | H01L 24/85 228/8 |
| 4,340,166 A | * | 7/1982 | Bilane | G05B 19/182 228/180.5 |
| 5,152,450 A | * | 10/1992 | Okikawa | H01L 24/78 228/205 |
| 5,285,949 A | * | 2/1994 | Okikawa | B23K 20/007 228/205 |

* cited by examiner

*Primary Examiner* — Devang R Patel
(74) *Attorney, Agent, or Firm* — Getech Law LLC; Jun Ye

(57) ABSTRACT

The present disclosure relates to a full-automatic deep access ball bonding head device includes: a Z-axis base; a Z-axis sliding stage, which is connected to the Z-axis base in a sliding manner along Z-axis; an EFO mechanism; and a bonding mechanism, which is fixed on the Z-axis sliding stage. The EFO mechanism includes an EFO sliding block, an EFO wand, and a compressed spring. The EFO sliding block is located on the side of the Z-axis sliding stage and connected to the Z-axis base in a sliding manner. The compressed spring is connected between the upper end of the Z-axis sliding stage and the upper end of the EFO sliding block, and the EFO wand is connected to the lower end of the EFO sliding block.

11 Claims, 6 Drawing Sheets

FULL-AUTOMATIC DEEP ACCESS BALL BONDING HEAD DEVICE

TECHNICAL FIELD

The present invention relates to a bonding apparatus, in particular to a full-automatic deep access ball bonding head device.

BACKGROUND

The full-automatic deep access ball bonding machine is an apparatus that is used to make metal wires electrically connected to pins of semiconductor chips through ultrasonic waves, pressure and high temperature. The first bonding point is spherical. The high voltage applied to the EFO (Electronic Flame Off) breaks through the air, forming a current loop with the metal wire on the nearby capillary tip, and melting the metal wire partially into a spherical shape. The ball bonding is relatively more reliable and thus usually applied to the bonding pads of dies or the first bonding point. In order to form the current loop, the distance between the end of the EFO and the tip of the capillary is required to be short enough for the voltage to break through the air. This puts forward two requirements for the EFO mechanism of the full-automatic deep access ball bonding machine. First, the capillary can be used for bonding at different heights within a certain range, which requires that EFO, serving for ignition, is movable within a large range in Z direction as the capillary. Second, the EFO system must not block the up and down movement of the bonding head. Fast and high reliability are the basic requirements of the EFO system.

SUMMARY

The technical problem to be solved by the present disclosure is to overcome the above problems and provide a full-automatic deep access ball bonding head device. In this device, the EFO mechanism can move synchronously with the capillary within a large range while the ignition may be performed in its static state. The bonding movement is not blocked and the ignition operation would be faster and more reliable.

In order to achieve the above-mentioned object of the invention, the technical solutions adopted to solve its technical problems are as follows: A full-automatic deep access ball bonding head device, comprising: a Z-axis base; a Z-axis sliding stage, which is connected to the Z-axis base in a sliding manner along Z-axis; an EFO mechanism; and a bonding mechanism, which is fixed on the Z-axis sliding stage, wherein, the EFO mechanism comprises an EFO sliding block, an EFO wand, and a compressed spring; the EFO sliding block is located on the side of the Z-axis sliding stage and connected to the Z-axis base in a sliding manner; the compressed spring is connected between the upper end of the Z-axis sliding stage and the upper end of the EFO sliding block, and the EFO wand is connected to the lower end of the EFO sliding block;

the lower end of the Z-axis sliding stage is provided with a driving contact, the EFO sliding block is provided with a corresponding driven contact, and the driving contact and the driven contact are pressed against each other to make the EFO mechanism and the Z-axis sliding stage move synchronously; and the Z-axis base is provided with a stopper which prevents the EFO sliding block from moving downward, and the driving contact is separated from the driven contact to make the EFO mechanism keep stationary.

With the above structure, during the movement within a large range in the present disclosure, the EFO sliding block have the driven contact pressed against the driving contact all the time due to the action of the spring. Thus, the EFO sliding block follows the Z-axis sliding stage and the bonding mechanism to vertically move together. At this time, the device is in a large-distance synchronous motion state. When the Z-axis sliding stage and the bonding mechanism descend to a certain position, the EFO sliding block comes into contact with the stopper, which limits the continued movement of the EFO mechanism, while the Z-axis sliding stage and the bonding mechanism continue to move downward to perform the bonding operation on the electronic devices. The device is in a static ignition state at this time.

Further, in the full-automatic deep access ball bonding head device of the present disclosure, the lower end of the EFO sliding block is provided with a rotating mechanism, and the output end of the rotating mechanism is connected to the EFO wand and drive the EFO wand to rotate around the Z-axis.

Further, in the full-automatic deep access ball bonding head device of the present disclosure, the rotating mechanism comprises a rotating solenoid, a first voice coil motor or a pneumatic element.

Further, in the full-automatic deep access ball bonding head device according to the present disclosure, the stopper is connected to the Z-axis base in an adjustable manner.

Further, in the full-automatic deep access ball bonding head device of the present disclosure, the bonding mechanism comprises a capillary, a transducer, a second voice coil motor, and a parallelogram mechanism; the parallelogram mechanism is connected to the Z-axis sliding stage; the transducer is provided at the front end of the parallelogram mechanism and connected to the capillary; and the second voice coil motor is fixed on the Z-axis sliding stage and connected to the transducer to adjust bonding force.

Further, in the full-automatic deep access ball bonding head device according to the present disclosure, between the Z-axis base and the Z-axis sliding stage there is provided with a Z-axis linear motor for driving the Z-axis sliding stage to slide along the Z-axis.

Further, in the full-automatic deep access ball bonding head device of the present disclosure, between the Z-axis base and the Z-axis sliding stage there is provided with a first guide rail extending along the Z-axis and the Z-axis sliding stage is fitted on the Z-axis base in a sliding manner by means of the first guide rail.

Further, in the full-automatic deep access ball bonding head device of the present disclosure, between the Z-axis base and the EFO sliding block there is provided with a second guide rail extending along the Z-axis and the EFO sliding block is fitted on the Z-axis base in a sliding manner by means of the second guide rail.

Further, in the full-automatic deep access ball bonding head device of the present disclosure, a measuring ruler assembly for measuring a movement distance of the Z-axis sliding stage along the Z-axis is provided between the Z-axis base and the Z-axis sliding stage.

Further, in the full-automatic deep access ball bonding head device according to the present disclosure, the parallelogram mechanism is further provided with a measuring ruler assembly for measuring a movement distance of the parallelogram mechanism along the Z-axis.

Further, in the full-automatic deep access ball bonding head device according to the present disclosure, a third guide rail extending along the Z-axis is provided between the stopper and the Z-axis sliding stage, and the stopper can move vertically relative to the Z-axis sliding stage along the third guide rail.

Further, in the full-automatic deep access ball bonding head device of the present disclosure, the Z-axis sliding stage is provided with a driving device, which is used to control the vertical movement of the stopper along the third guide rail, and to position the stopper at a preset height.

The beneficial effects of the present invention are:

1. The device according to the present invention has simple structure and reasonable design, and has the dual functions of static ignition and synchronous displacement, which can not only meet the purpose of the EFO wand mechanism moving with the capillary in a long range Z-axis, but also not hinder the vertical movement of the bonding mechanism, so that the ignition operation would be faster and more reliable.

2. The device according to the present invention can also has a rotating mechanism to achieve the rotational positioning of the EFO wand, so that the EFO wand may be aligned to under the capillary tip before the ignition operation, which significantly improves the quality and reliability of the ignition. The EFO wand can be rotated back after the completion of the ignition, not affecting the downward movement and the bonding operation of the bonding mechanism.

3. The position of the stopper can be adjusted vertically, which can ensure the optimal balance between the ignition efficiency and avoiding part interference.

4. The position of the stopper can be adjusted programmably in vertically through the driving motor, which saves labor time and improves efficiency.

DETAILED DESCRIPTION OF EMBODIMENTS

In the following, the technical solutions in the embodiments of the present invention will be described and discussed clearly and completely with reference to the accompanying drawings. Obviously, what is described here is only part, rather than all, of the examples of the present invention. Based on the described embodiments herein, those skilled in the art can obtain other embodiment(s), without any inventive work, which should be within the scope of the present disclosure.

Embodiment 1

Figure 1:
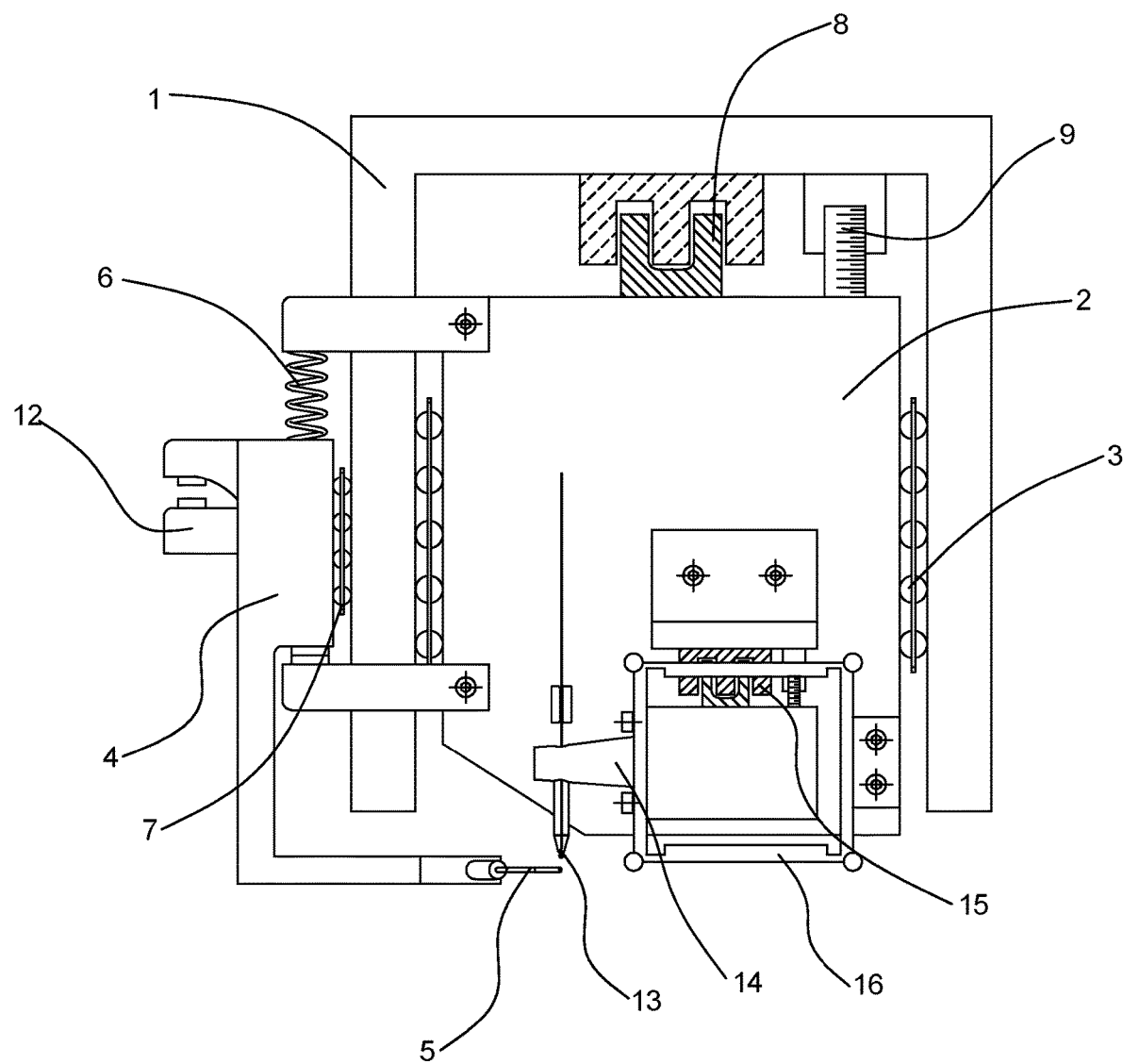
FIG. 1 schematically shows the structure of the automatic deep access ball bonding head device in the driven state in Embodiment 1 and Embodiment 3.
Figure 2:
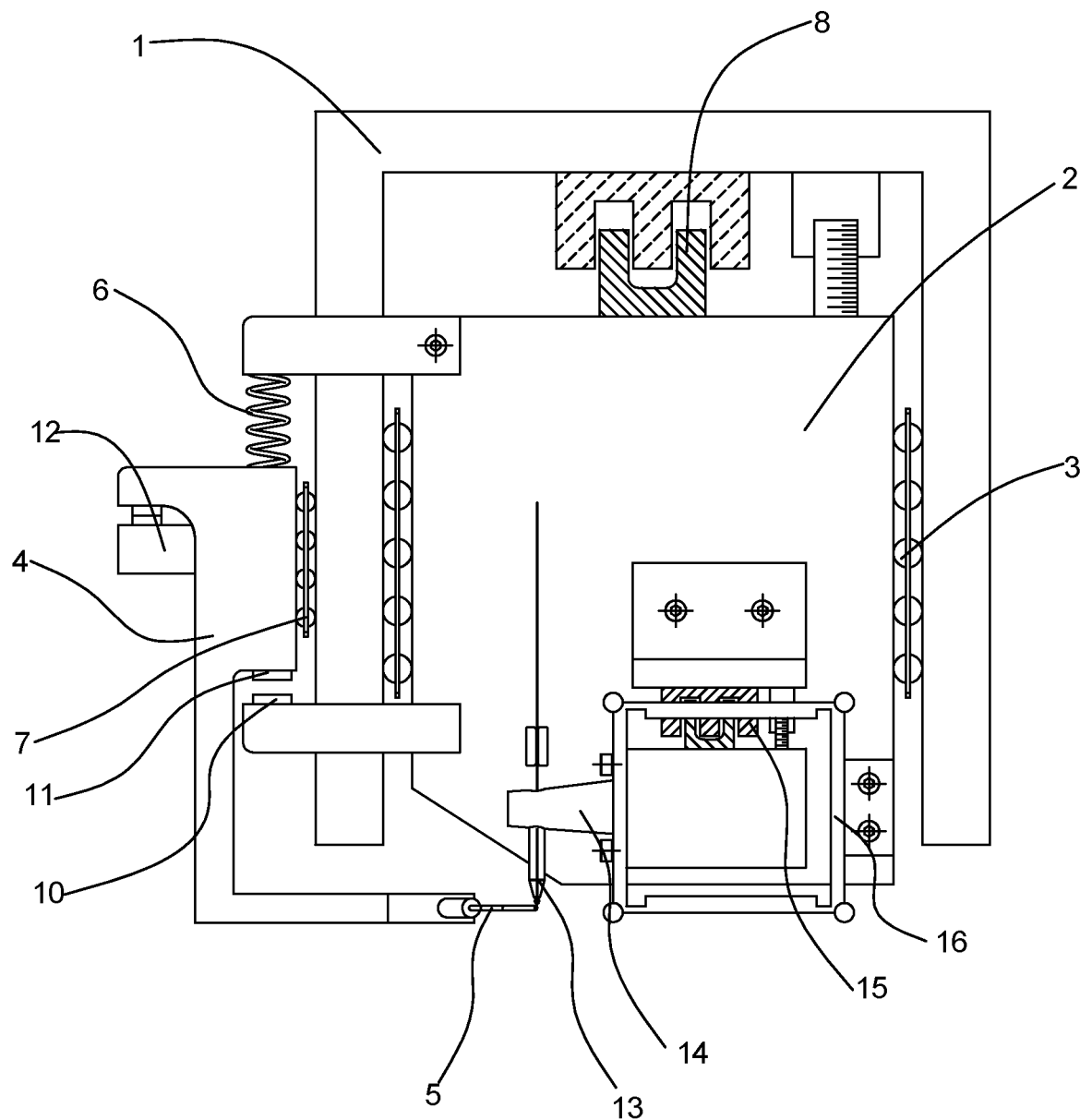
FIG. 2 schematically shows the structure of the automatic deep access ball bonding head device in the ignition state in Embodiment 1.

Referring to FIGS. 1 and 2, a full-automatic deep access ball bonding head device described in this embodiment includes a base 1 which is fixed in Z direction, a sliding stage 2 which is movable in Z direction, an EFO mechanism, and a bonding mechanism. The bonding mechanism is fixed on the sliding stage 2. The sliding stage 2 and the base 1 are connected in such a manner that the sliding stage 2 can slide along the Z-axis. A first guide rail 3 extending along the Z-axis is provided between the base 1 and the sliding stage 2. The sliding stage 2 is fitted on the base 1 in a sliding manner by means of the first guide rail 3. Between the base 1 and the sliding stage 2, there is provided with linear motor 8 for driving the sliding stage 2 to slide along the Z-axis. A measuring ruler assembly 9 for measuring the movement distance of the sliding stage 2 along the Z-axis is provided between the base 1 and the sliding stage 2.

The EFO wand mechanism includes an EFO sliding block 4, an EFO wand 5, and a compressed spring 6. The EFO sliding block 4 is located on the side of the sliding stage 2 and connected to the base 1 in a sliding manner along the Z-axis. Between the base 1 and the EFO sliding block 4 there is provided with a second guide rail 7 extending along the Z-axis. The EFO sliding block 4 is fitted on the base 1 in a sliding manner by means of the second guide rail 7. The compressed spring 6 is connected between the upper end of the sliding stage 2 and the upper end of the EFO sliding block 4, and the EFO wand 5 is connected to the lower end of the EFO sliding block 4. The sliding stage 2 is provided with a driving contact 10 at its lower end. Correspondingly, the EFO sliding block 4 is provided with a driven contact 11. The driven contact 11 and the driving contact 10 are pressed against each other to make the EFO mechanism and the sliding stage 2 move synchronously. The base 1 is further provided with a stopper 12. The stopper 12 can prevent the EFO sliding block 4 from moving downward further. The driving contact 10 is separated from the driven contact 11 and the EFO wand mechanism keeps stationary.

The bonding mechanism comprises a capillary 13, a transducer 14, a second voice coil motor 15, and a parallelogram mechanism 16. The parallelogram mechanism 16 is connected to the sliding stage 2. The transducer 14 is provided at the front end of the parallelogram mechanism 16 and connected to the capillary 13. The second voice coil motor 15 is fixed on the sliding stage 2 and connected to the transducer 14 to adjust the bonding force. In order to feedback the micro-momentum of the parallelogram mechanism 16 accurately, the parallelogram mechanism 16 is further provided with a measuring ruler assembly 9 for measuring the movement distance of the parallelogram mechanism 16 along the Z-axis. A grating ruler may be used as the above-mentioned measuring ruler assembly 9.

The working principle of this structure is: when the sliding stage 2 drives the bonding mechanism to slide down for a large distance, due to the action of the compressed spring 6, the driven contact 11 is pressed against the driving contact 10 to make the EFO sliding block 4 moves together with the sliding stage 2. This is the driven state. When the EFO sliding block 4 descends to the stopper 12, the EFO sliding block 4 is blocked by the stopper 12 and pressed against the stopper 12 by the compressed spring 6, with the entire EFO wand mechanism in a stationary state. In this case, the EFO wand mechanism is in the ignition state, and the ignition operation between the EFO wand 5 and the capillary 13 may be performed. Then, the sliding stage 2 carries the bonding mechanism to continue to descent so as to perform the bonding operation. Conversely, when the sliding stage 2 slides upward to a certain position, the driving contact 10 presses the driven contact 11 upwards, so that the EFO sliding block 4 and the sliding stage 2 return to the driven state, driving the EFO wand 5 to move upward within a large range of height.

Embodiment 2

Figure 3:
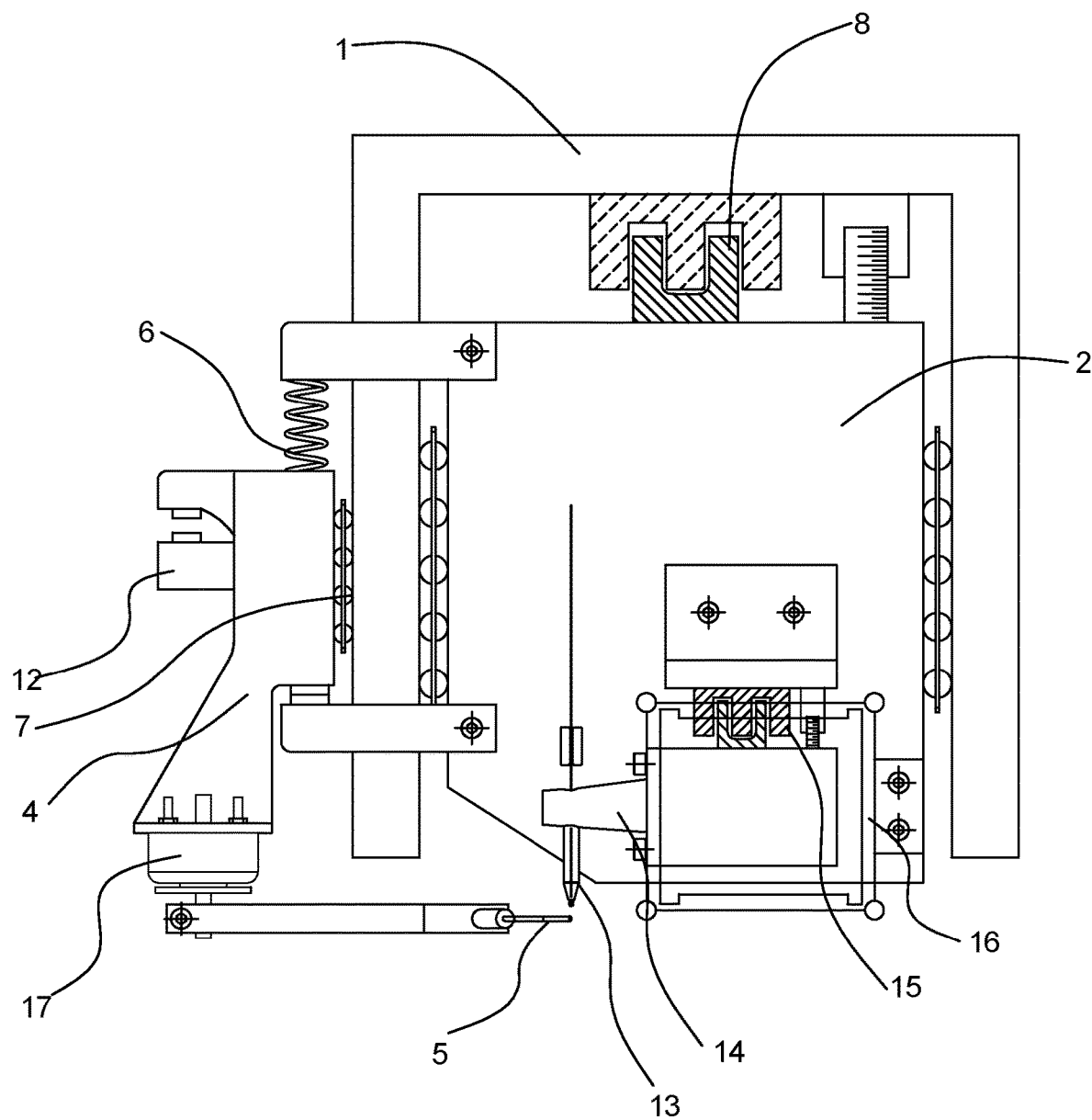
FIG. 3 schematically shows the structure of the automatic deep access ball bonding head device in the ignition state in Embodiment 2.

As shown in FIG. 3, the structure of this embodiment is substantially the same as that of Embodiment 1 except that: The lower end of the EFO sliding block 4 is provided with a rotating mechanism 17. The output end of the rotating mechanism 17 is connected to the EFO 5 wand and drive the EFO wand 5 to rotate around the Z-axis. The rotating mechanism 17 includes a rotating solenoid or the first voice coil motor or a pneumatic element. In the structure according to the present embodiment, the EFO wand 5 can be rotated directly under the capillary 13 so as to improve the reliability and consistency of the ignition operation. After the ignition operation is completed, the EFO wand 5 rotates away, so that the transducer 14 and the capillary 13 continue to move downward to perform bonding.

Embodiment 3

The structure of this embodiment is substantially the same as that of Embodiment 1 except that: The stopper 12 is connected to the base 1 in an adjustable manner. The stopper 12 can be adjusted to move up and down along the base 1 to a desired position as required, where the ignition efficiency may be improved while the electronic devices may be avoided.

Embodiment 4

Figure 4:
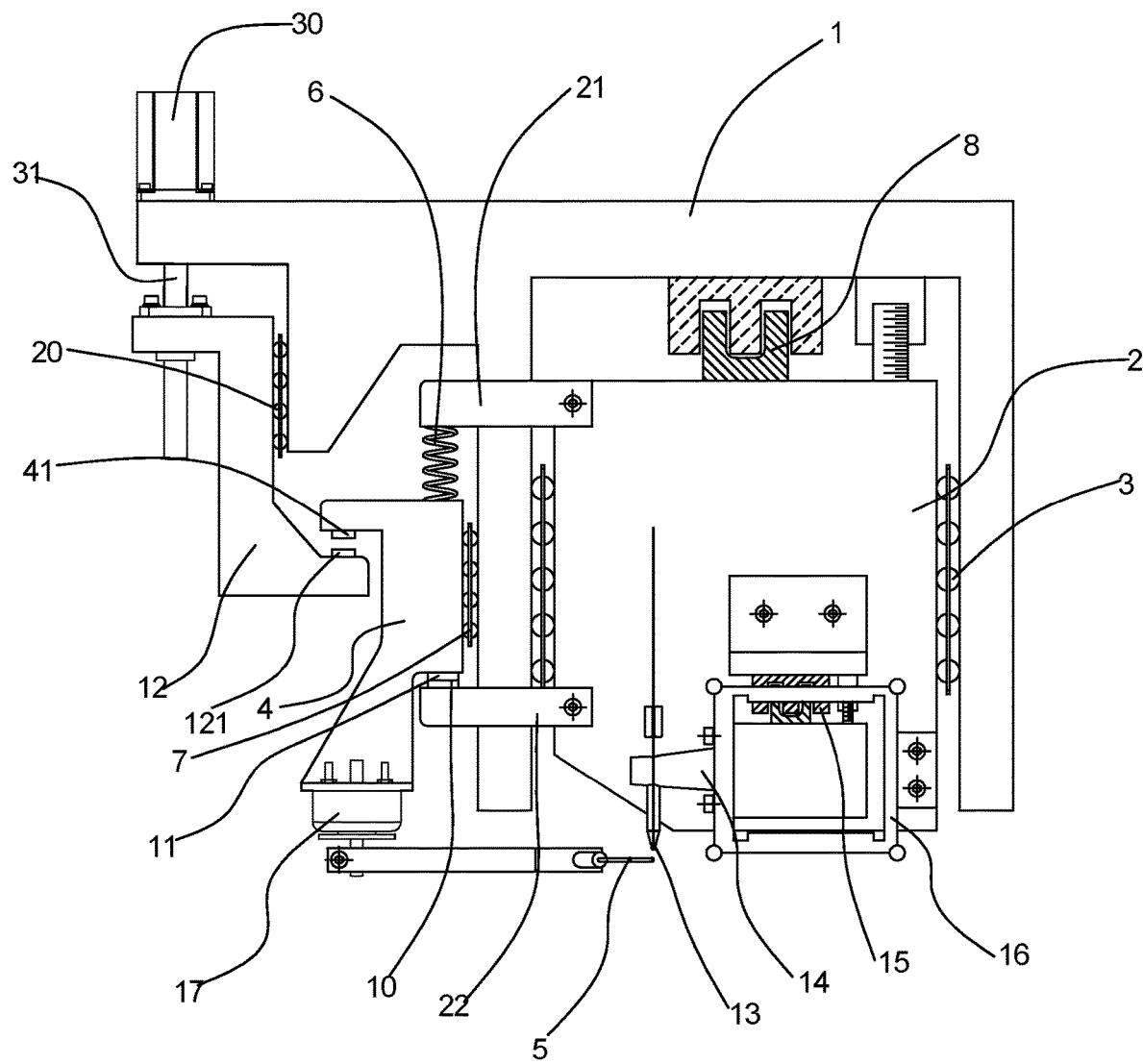
FIG. 4 schematically shows the structure of the automatic deep access ball bonding head device in the driven state in Embodiment 4.
Figure 5:
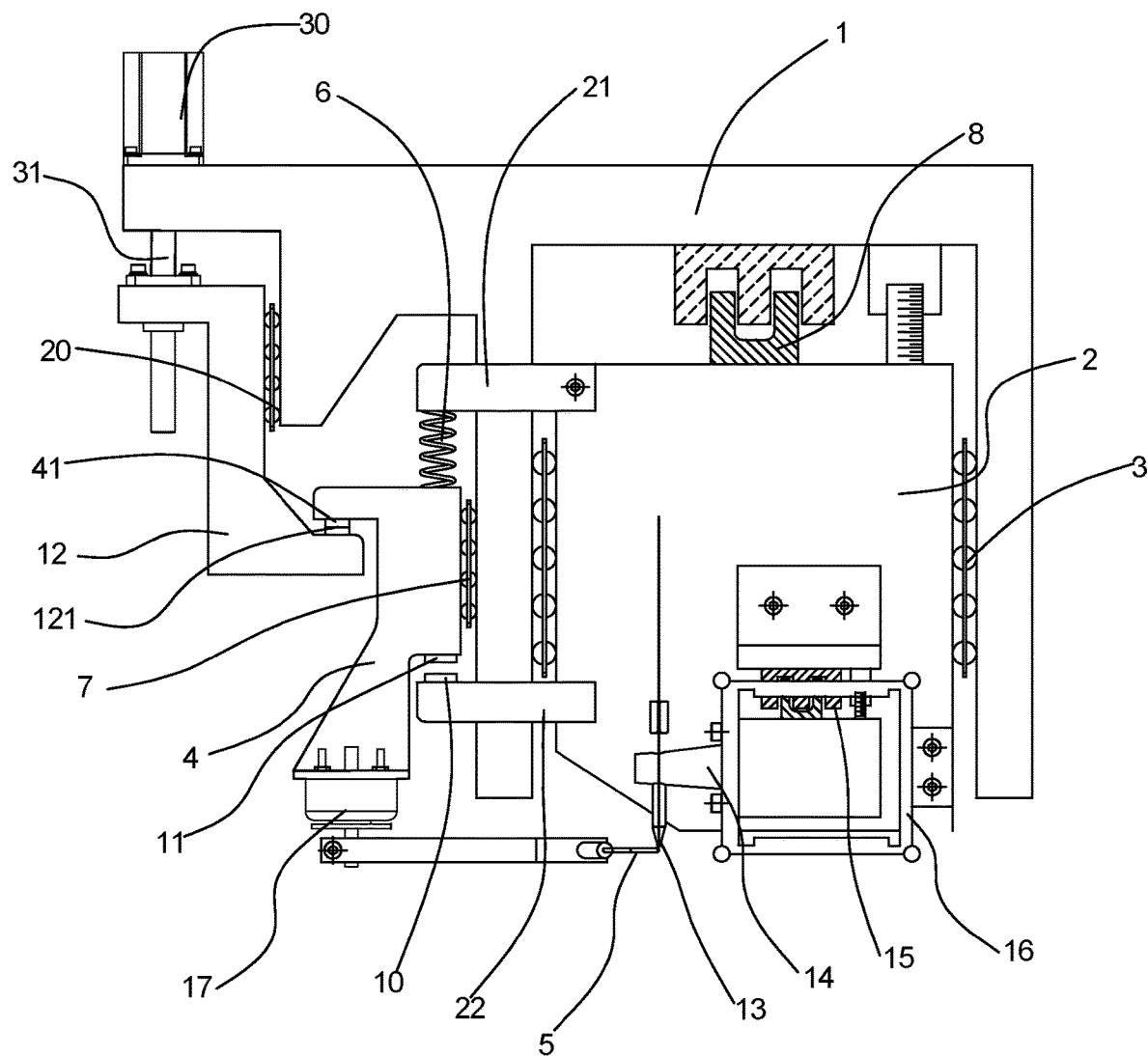
FIG. 5 schematically shows the structure of the automatic deep access ball bonding head device in the ignition state in Embodiment 4.
Figure 6:
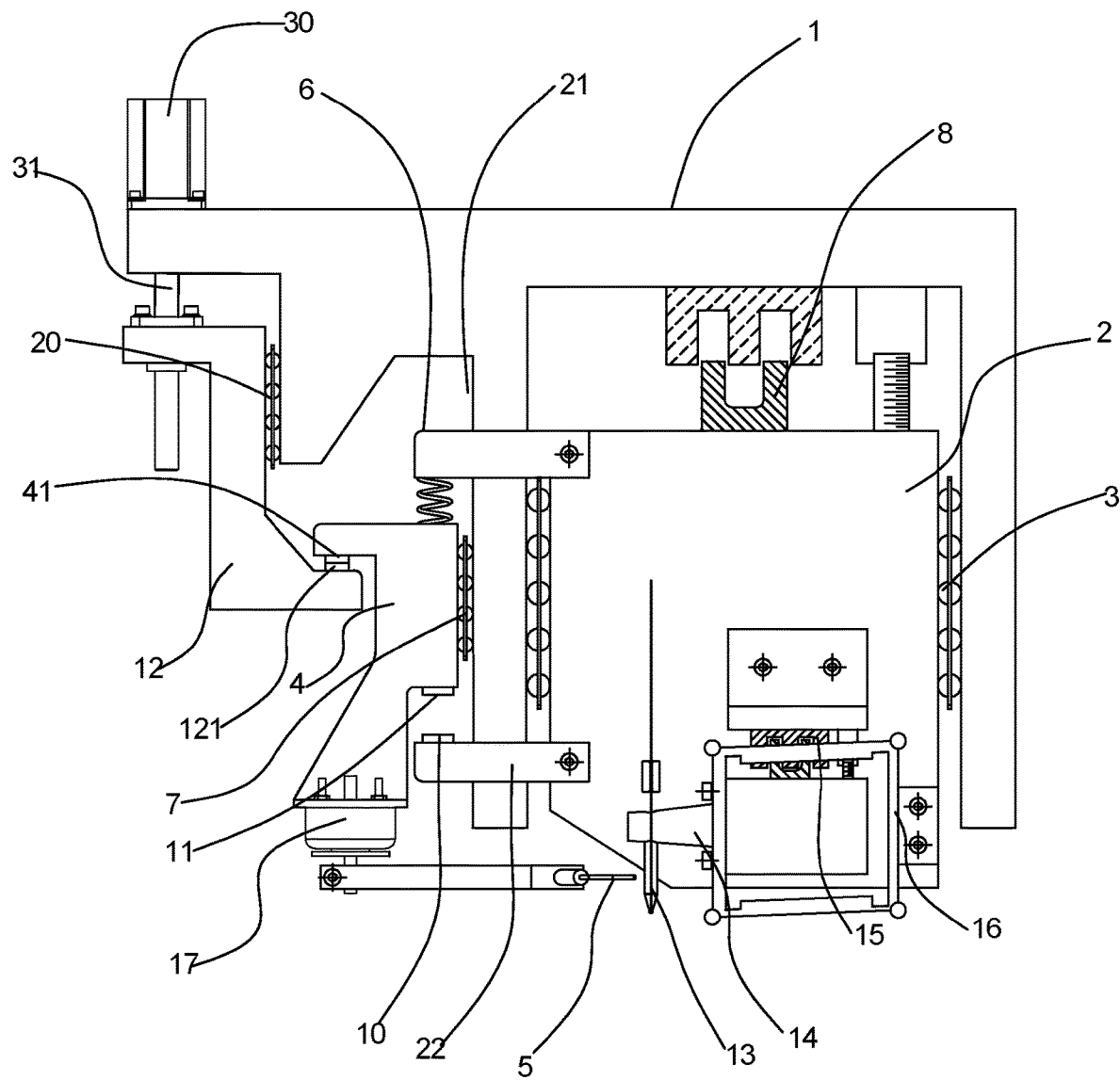
FIG. 6 schematically shows the structure of the automatic deep access ball bonding head device in the bonding state in Embodiment 4.

The structure in this embodiment is similar to the structure in Embodiment 3. As shown in FIGS. 4-6, in this embodiment, the position of the stopper 12 can be adjusted up and down with respective to the base 1. The full-automatic deep access ball bonding head of this embodiment comprises a base 1, a sliding stage 2, an EFO mechanism and a bonding mechanism. The base 1 and the sliding stage 2 are both arranged vertically. In a general three-dimensional coordinate system, the Z-axis is usually used to indicate the vertical direction. Therefore, the base and the sliding stage are also called a Z-axis base and a Z-axis sliding stage, respectively.

The base 1 is arranged fixedly. The sliding stage 2 is connected to the base 1 in a sliding manner. The sliding stage 2 can move along the Z-axis with respect to the base 1. Preferably, between the sliding stage 2 and the base 1, there is provided with a first guide rail 3, which extends vertically i.e., along the Z-axis. The sliding stage 2 and the base 1 is fitted in a sliding manner by means of the first guide rail 3. Between the base 1 and the sliding stage 2, there is provided with a linear motor 8 for driving the sliding stage 2 to move up and down. A measuring ruler assembly 9 for measuring the movement distance of the sliding stage 2 along the Z-axis is provided on the base 1.

The EFO mechanism is provided on the side of the base 1, and can move up and down with respective to the base 1. Preferably, between the base 1 and the EFO mechanism, there is further provided with a second guide rail 7 extending along the Z-axis. The EFO mechanism may move up and down along the second guide rail 7 relative to the base 1. The EFO mechanism includes an EFO sliding block 4, an EFO wand 5, and a compressed spring 6. The EFO sliding block 4 is located on the side of the sliding stage 2 and connected to the base 1 in a sliding manner along the Z-axis. Particularly, between the base 1 and the EFO sliding block 4 there is provided with a second guide rail 7 extending along the Z-axis. The EFO sliding block 4 is fitted on the base 1 in a sliding manner by means of the second guide rail 7.

The compressed spring 6 is connected between the upper end of the sliding stage 2 and the upper end of the EFO sliding block 4. The EFO 5 wand is connected to the lower end of the EFO sliding block 4 and extends horizontally. The lower end of the sliding stage 2 is provided with a driving contact 10 which faces up, and the EFO sliding block 4 is provided with a driven contact 11 which faces down. The driven contact 11 and the driving contact 10 are arranged to face each other correspondingly in the vertical direction. The driven contact 11 is located above the driving contact 10. The driven contact 11 and the driving contact 10 are pressed against each other to make the EFO mechanism and the sliding stage 2 move synchronously. The compressed spring 6 applies a downward pressure on the EFO sliding block 4, so that the EFO sliding block 4 presses downward against the driving contact 10, thereby enabling the EFO mechanism to follow the sliding stage 2 to move synchronously in the driven state. The synchronized movement may be an upward movement or a downward movement.

Preferably, the upper end of the sliding stage 2 is provided with a first connecting block 21 extending laterally, and the compressed spring 6 is connected between the connecting block 21 and the EFO sliding block 4. The lower end of the sliding stage 2 is provided with a second connecting block 22 extending horizontally. The second connecting block 22 and the first connecting block 21 are separated to each other vertically. The second connecting block 22 is provided with the driving contacts 10 which faces up.

The base 1 is further provided with a stopper 12. The stopper 12 is arranged horizontally. The stopper 12 can prevent the EFO sliding block 4 from moving downward. When the stopper 12 and the EFO sliding block 4 are pressed against each other and thus the EFO sliding block 4 cannot move down further, the driving contact 10 and the driven contact 11 are disengaged, with the entire EFO mechanism in a stationary state. In this case, the EFO mechanism is in the ignition state, and the ignition operation between the EFO wand 5 and the capillary 13 of the bonding mechanism may be performed.

Specifically, the bonding mechanism is connected to the sliding stage 2, and may move up and down with the sliding stage 2. The bonding mechanism and the EFO mechanism are matched and set correspondingly. In the ignition state, the EFO mechanism and the bonding mechanism perform the ignition operation. Preferably, the bonding mechanism comprises a capillary 13, a transducer 14, a second voice coil motor 15, and a parallelogram mechanism 16. The parallelogram mechanism 16 is connected to the sliding stage 2. The transducer 14 is provided at the front end of the parallelogram mechanism 16 and connected to the capillary 13. The second voice coil motor 15 is fixed on the sliding stage 2 and connected to the transducer 14 to adjust the bonding force.

In order to feedback the micro-momentum of the parallelogram mechanism accurately, the parallelogram mechanism is further provided with a measuring ruler assembly for measuring the movement distance of the parallelogram mechanism along the Z-axis. A grating ruler may be used as the above-mentioned measuring ruler assembly for measuring the distance of the vertical movement of the sliding stage, and as the measuring ruler assembly for measuring distance of the vertical movement of the parallelogram mechanism along the Z-axis.

The lower end of the EFO sliding block 4 is provided with a rotating mechanism 17. The output end of the rotating mechanism 17 is connected to the EFO wand 5 and drives the EFO wand 5 to rotate horizontally around the Z-axis. The rotating mechanism 17 includes a rotating solenoid or the first voice coil motor or a pneumatic element. The EFO 5 wand can be rotated horizontally around the Z-axis just under the capillary 13 so as to improve the reliability and consistency of the ignition operation.

The working principle of the full-automatic deep access ball bonding head device is specifically as follows: When the sliding stage 2 drives the bonding mechanism to slide down for a large distance, due to the downward pressure of the compressed spring 6, the driven contact 11 of the EFO mechanism is pressed against the driving contact 10 of the sliding stage 2 to make the EFO sliding block 4 moves together with the sliding stage 2. This is the driven state, as shown in FIG. 4. When the EFO mechanism descends to the stopper 12 (i.e., the EFO mechanism is pressed against the stopper 12, and the EFO mechanism is in its lowest position now), the EFO sliding block 4 is blocked by the stopper 12 and pressed against the stopper 12 by the compressed spring 6, with the entire EFO mechanism in a stationary state. In this case, the EFO mechanism is in the ignition state, as shown in FIG. 5, and the ignition operation between the EFO wand 5 and the capillary 13 may be performed. Then, the sliding stage 2 can carry the bonding mechanism to continue to descend so as to perform the bonding operation, while the EFO mechanism remains stationary at the lowest position limited by the stopper. Then, the driving contact 10 is separated from the driven contact 11 and the sliding stage 2 compresses the compressed spring 6 as it continues to descend, as shown in FIG. 6. In this state, the bonding mechanism performs the bonding operation on the electronic devices.

Conversely, when the sliding stage 2 slides upward to a certain position, the driving contact 10 presses the driven contact 11 upwards, so that the EFO sliding block 4 and the sliding stage 2 return to the driven state. The sliding stage 2 continues to move upward, and carries the EFO 5 and the EFO sliding block 4 to move upward simultaneously under the action of the compressed spring 6, the driven contact 11 and the driving contact 10.

Specifically, the stopper 12 is not directly fixed on the base 1. A third guide rail 20 is provided between the side of the stopper 12 and the base 1. The third guide rail 20 extends in the Z-axis direction, i.e., vertically. The stopper 12 can move up and down along the third guide rail 20. By adjusting the height of the stopper 12 with respect to the base 1, the lowest position, which the EFO mechanism can move downward to, can be adjusted, as shown in FIG. 6. When the bonding mechanism is working, the distance between the EFO wand of the EFO mechanism and the bonding plane below the EFO wand can be adjusted by altering the vertical position of the stopper 12 with respect to the base 1. Therefore, the distance between the EFO mechanism and the bonding plane can be adjusted according to different process conditions.

Preferably, the base 1 is provided with a driving device 30 which drives the transmission mechanism 31 to move along the Z-axis. The transmission mechanism 31 extends along the Z-axis. The transmission mechanism 31 is connected to the stopper 12. Therefore, the driving device 30 is used to control the vertical movement of the stopper 12, i.e., to control the movement of the stopper 12 along the third guide rail, and to maintain and position the stopper 12 at a preset height. Through setting the driving device 30, the vertical position of the stopper 12 relative to the base 1 can be controlled automatically. Thus, the lowest position, to which the EFO mechanism can move downward with respect to the base 1, can be adjusted automatically according to different process conditions. Specifically, the driving device may be a motor, a solenoid or other driving mechanism. For example, the driving device 30 may be a motor, and the transmission mechanism 31 may be a lead screw and nut. The motor drives the lead screw to rotate to make the nut move vertically along the screw. The nut is fixed to the stopper 12 to adjust its height.

More preferably, the side of the EFO sliding block 4 is provided with a first contact 41 which faces down, and the stopper 12 is provided with a second contact 121 which faces up. The contact 41 and the second contact 121 are arranged to face each other correspondingly in the vertical direction, so that stopper 12 can prevent the EFO mechanism from moving downward further.

The full-automatic deep access ball bonding machine of the present disclosure uses ultrasonic energy, pressure, heat and time to connect the metal wire to the first bonding point and the second bonding point, thereby realizing the electrical connection between electronic devices and external applications. The first bonding point is usually a ball bonding point. The metal ball is made though forming a high-pressure discharge at the tail of the metal wire by the EFO wand to form a partial fusion. After the metal ball is generated, the bonding head descends so that the capillary would contact the first bonding point to perform bonding. The access depth near the electronic devices varies from electronic device to electronic device, and the height of the traditional EFO wand from the bonding plane must be set to fit the largest cavity depth so as to suit all applications. Therefore, the Z-axis stroke for each ignition is increased undesirably, which lengthens the bonding cycle. Depending on the different access depths, different heights of the EFO can be programmed to achieve the minimum Z-axis stroke and shorten the bonding cycle.

The specific embodiments described herein are only illustrative of the principles and effects of the present disclosure, and are not intended to limit the present disclosure. Those skilled in the art can modify or change the above embodiments without departing from the spirit and scope of the present disclosure. Therefore, all equivalent modifications or changes made by those skilled in the art without departing from the spirit and technical ideas disclosed in the present disclosure should still be covered by the claims of the present disclosure.

What is claimed:

1. A full-automatic ball bonding head device, comprising:
a Z-axis base;
a Z-axis sliding stage, which is connected to the Z-axis base in a sliding manner along Z-axis;
an EFO mechanism; and a bonding mechanism, which is fixed on the Z-axis sliding stage;
wherein,
the EFO mechanism comprises an EFO sliding block, an EFO wand, and a compressed spring;
the EFO sliding block is located on the side of the Z-axis sliding stage and connected to the Z-axis base in a sliding manner;
the compressed spring is connected between the upper end of the Z-axis sliding stage and the upper end of the EFO sliding block, and the EFO wand is connected to the lower end of the EFO sliding block;
the lower end of the Z-axis sliding stage is provided with a driving contact, the EFO sliding block is provided with a corresponding driven contact, and the driving contact and the driven contact are pressed against each other to make the EFO mechanism and the Z-axis sliding stage move synchronously; and the Z-axis base is provided with a stopper via a guide rail, wherein the stopper is connected to the Z-axis base in an adjustable matter via the guide rail and prevents the EFO sliding block from moving downward, and the driving contact is separated from the driven contact to make the EFO mechanism keep stationary.

2. The full-automatic ball bonding head device according to claim 1, wherein, the lower end of the EFO sliding block is provided with a rotating mechanism, and the output end of the rotating mechanism is connected to the EFO wand and drive the EFO wand to rotate around the Z-axis.

3. The full-automatic ball bonding head device according to claim 2, wherein the rotating mechanism comprises a rotating solenoid, a first voice coil motor or a pneumatic element.

4. The full-automatic ball bonding head device according to claim 1, wherein, the bonding mechanism comprises a capillary, a transducer, a second voice coil motor, and a parallelogram mechanism;

the parallelogram mechanism is connected to the Z-axis sliding stage;

the transducer is provided at the front end of the parallelogram mechanism and connected to the capillary; and the second voice coil motor is fixed on the Z-axis sliding stage and connected to the transducer to adjust bonding force.

5. The full-automatic ball bonding head device according to claim 1, wherein, between the Z-axis base and the Z-axis sliding stage there is provided with a Z-axis linear motor for driving the Z-axis sliding stage to slide along the Z-axis.

6. The full-automatic ball bonding head device according to claim 1, wherein, between the Z-axis base and the Z-axis sliding stage there is provided with a first guide rail extending along the Z-axis and the Z-axis sliding stage is fitted on the Z-axis base in a sliding manner by means of the first guide rail.

7. The full-automatic ball bonding head device according to claim 1, wherein, between the Z-axis base and the EFO sliding block there is provided with a second guide rail extending along the Z-axis and the EFO sliding block is fitted on the Z-axis base in a sliding manner by means of the second guide rail.

8. The full-automatic ball bonding head device according to claim 1, wherein, a measuring ruler assembly for measuring a movement distance of the Z-axis sliding stage along the Z-axis is provided between the Z-axis base and the Z-axis sliding stage.

9. The full-automatic ball bonding head device according to claim 4, wherein, the parallelogram mechanism is further provided with a measuring ruler assembly for measuring a movement distance of the parallelogram mechanism along the Z-axis.

10. The full-automatic ball bonding head device according to claim 1, wherein a third guide rail extending along the Z-axis is provided between the stopper and the base, and the stopper can move vertically relative to the base along the third guide rail.

11. The full-automatic ball bonding head device according to claim 10, wherein, the base is provided with a driving device, which is used to control the vertical movement of the stopper along the third guide rail, and to position the stopper at a preset height.

* * * * *